United States Patent [19]

Norman et al.

[11] Patent Number: 5,768,287
[45] Date of Patent: Jun. 16, 1998

[54] APPARATUS AND METHOD FOR PROGRAMMING MULTISTATE MEMORY DEVICE

[75] Inventors: Robert D. Norman, San Jose; Christophe J. Chevallier, Palo Alto; Vinod Lakhani, Milpitas, all of Calif.

[73] Assignee: Micron Quantum Devices, Inc., Santa Clara, Calif.

[21] Appl. No.: 735,915

[22] Filed: Oct. 24, 1996

[51] Int. Cl.[6] ............................................ G06F 11/00
[52] U.S. Cl. .................................................. 371/21.2
[58] Field of Search .......................... 371/21.2, 21.3, 371/21.4, 21.8; 365/168, 189.01

[56] References Cited

U.S. PATENT DOCUMENTS 5,043,940 8/1991 Harari ......................... 365/168
5,394,362 2/1995 Banks ....................... 365/189.01

Primary Examiner—Vincent P. Canney
Attorney, Agent, or Firm—Schwegman, Lundberg, Woessner & Kluth, P.A.

[57] ABSTRACT

An apparatus and method for programming the memory cells of a multistate memory. The method involves the collapsing of data before transmitting to the memory cells. A controller generates optimized program pulses of high voltage to apply to the memory cells. The pulses vary in amplitude and time, depending on the state level being transitioned. Program verify is performed by reading the programmed data back into the controller where it is compared with the original value intended for programming. This compare operation modifies the data read and initial data to reflect which memory cells require further programming. The modified data is again collapsed and sent to the memory for further programming and verify cycles until a monitoring circuit within the controller detects that no further programming is required.

26 Claims, 6 Drawing Sheets

APPARATUS AND METHOD FOR PROGRAMMING MULTISTATE MEMORY DEVICE

TECHNICAL FIELD

The present invention relates to multistate memory devices, and more specifically, to an apparatus and method for programming such devices and verifying the programmed data.

BACKGROUND OF THE INVENTION

In conventional single-bit per cell memory devices, the memory cell assumes one of two information storage states, either an "on" state or an "off" state. The binary condition of "on" or "off" defines one bit of information. As a result, a memory device capable of storing n-bits of data requires (n) separate memory cells.

Increasing the number of bits which can be stored using single-bit per cell memory devices depends upon increasing the number of memory cells on a one-for-one basis with the number of bits of data to be stored. Methods for increasing the number of memory bits stored in a memory device composed of single-bit capacity cells have relied upon techniques such as manufacturing larger die which contain more memory cells, or using improved photolithography techniques to build smaller memory cells. This is effective because reducing the size of a memory cell allows more cells to be placed on a given area of a single die.

An alternative to single-bit per cell designs is the storage of multiple-bits of data in a single memory cell. One type of memory in which this approach has been followed is an electrically erasable and programmable device known as a flash memory cell. In flash cells, programming is carried out by applying appropriate voltages to the source, drain, and control gate of the device for an appropriate time period. This causes electrons to tunnel or be injected from a channel region to a floating gate. The amount of charge residing on the floating gate determines the voltage required on the control gate in order to cause the device to conduct current between the source and drain regions. This voltage is termed the threshold voltage, $V_{th}$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at the given set of applied voltages, the state of the cell (programmed or erased) can be found.

A multi-bit or multistate flash memory cell is produced by creating multiple, distinct threshold voltage levels within the device. Each distinct threshold voltage corresponds to a value of a set of data bits, with the number of bits representing the amount of data which can be stored in the multistate cell. This method allows multiple bits of binary data to be stored within the same memory cell. When reading the state of the memory cell, the threshold voltage value or range of values for which the memory cell conducts current (as determined by comparison with a sense amplifier having a preselected reference value) corresponds to a binary decoded value representing the programmed data. The threshold voltage level for which the cell conducts thus corresponds to a bit set representing the data programmed into the cell. Proper data storage requires that the multiple threshold voltage levels of a memory cell be separated from each other by a sufficient amount so that a level of a cell can be programmed or erased in an unambiguous manner. The relationship between the data programmed into the memory cell and the threshold voltage levels of the cell depends upon the data encoding scheme adopted for the cells.

In programming a multistate memory cell, the objective is to apply a programming voltage over a proper time period to store enough charge in the floating gate to move the threshold voltage of the cell to a desired level. This level represents a state of the cell corresponding to an encoding of the data which is to be programmed into the cell. One method of programming such memory cells is to send digital data corresponding to the number of bits which can be programmed into a memory cell to the cell where it is encoded to determine the threshold voltage level which is to be set for that cell during a programming operation. The state machine for the memory system would then control the programming and data verification for eaLch bit. Although this method can be used to program multistate memory cells, it is inefficient and not cost-effective because the programming and encoding logic must be duplicated for each block of memory cells.

U.S. Pat. No. 5,043,940, entitled "Flash EEPROM Memory Systems Having Multistate Storage Cells", issued Aug. 27, 1991, describes a method of programming a multistate: memory cell in which an iterative read-compare-program cycle is executed. During the cycle, the data intended to be programmed into a memory cell is input to a comparator, along with the outputs from a set of sense amplifiers (each having a different reference voltage) connected to the cell. The output of the sense amplifiers indicates the threshold voltage level to which the cell is programmed. If the programmed threshold voltage level corresponds to the encoded representation of the intended data, then the cell is in the correct state.

If the intended data doesn't correspond to the programmed threshold voltage level, then a programming control circuit is activated. A single, short duration programming pulse is then applied to the cell, followed by another read operation using the sense amplifiers. This cycle is repeated until the data comparison operation indicates a correct threshold voltage level, or until the maximum number of programming pulses has been applied.

U.S. Pat. No. 5,394,362, entitled "Electrically Alterable Non-volatile Memory with N-bits per Memory cell", issued Feb. 28, 1995, describes a similar method of programming a multistate memory cell. An iterative cycle of determining the threshold voltage level of a cell, using the threshold voltage level to determine the data contained in the cell, comparing the data programmed into the cell to data intended to be programmed, and then generating a programming pulse to alter the cell's threshold voltage level is performed. This cycle is repeated using the same period and amplitude for the programming pulse during each cycle, until the sense amplifiers indicate that the cell has been properly programmed.

What is desired is an apparatus and method for programming the memory cells contained in a multistate memory system, which is more efficient and cost-effective than presently used methods.

SUMMARY OF THE INVENTION

The present invention is directed to an apparatus and method for programming a multistate memory cell which has the benefit of simplifying the memory design through a general purpose control method. The method involves a transformation of the data being programmed into the memory. Two data bits are collapsed to one data bit sent to the memory (16 data bits would be sent as 8 bits to be programmed). By performing the data bit collapsing (transformation) of 2 bits to 1 bit, the memory operation is simplified. The number of write registers is reduced in half and the memory system does not require write encoding logic; only an on/off (1/0) condition is required in the logic gating. The collapsing of the data by the controller, before transmission to the memory, also reduces the number of bits to be transmitted. This increases bus bandwidth and reduces the required transmission power. Following the transmission of data from the controller to the memory, a high voltage programming sequence is initiated on the memory by the controller (a program pulse). The program pulse is set to a short duration and voltage level and only the cells loaded with a 0 data bit are enabled to be programmed by the pulse. The amount of programming is sufficient to allow enough charge to be trapped in the floating to cause the cell to move one state level higher (one $V_{th}$ level different)

Following this program sequence the controller and memory performs a verify operation. This process looks at the data just programmed and modifies the resultant data, again collapsing the data from 2 bits to 1 on the interface. The program pulse sequence is again initiated and this verify operation is repeated. This cycle continues until the data programmed compares with the original data intended to be programmed or until a program cycle counter reaches its maximum setting.

During each write (programming) stage of the read-modify-write cycles, the programming pulse applied to the cell is adjusted to change the voltage and pulse duration of the applied programming pulse to move the threshold voltage level of the cell from its current level to the next highest level. This iterative approach to programming each state of a multistate memory cell uses different programming pulse times and pulse amplitudes (voltages) at each stage of the programming cycle. This allows greater flexibility in the programming process and reduces the number of programming pulses and cycles required, producing an optimized write operation.

The present invention achieves improved operation by removing the compare circuitry from the memory chip to a system controller, greatly simplifying the circuitry required to program and read a multistate memory cell. This can reduce the overall cost of the memory system. A further aspect of the present invention is that most of the data management tasks needed to operate the memory system are executed by the system controller under the control of appropriate software, instead of being hard-coded in the memory chip(s). This provides added flexibility and allows cost-efficient implementation of memory system functions. The invention is also directed to a method of generating the data programmed into the memory cells of the system.

Further objects and, advantages of the present invention will become apparent from the following detailed description and, accompanying drawings.

DETAILED DESCRIPTION OF THE INVENTION

Figure 1:
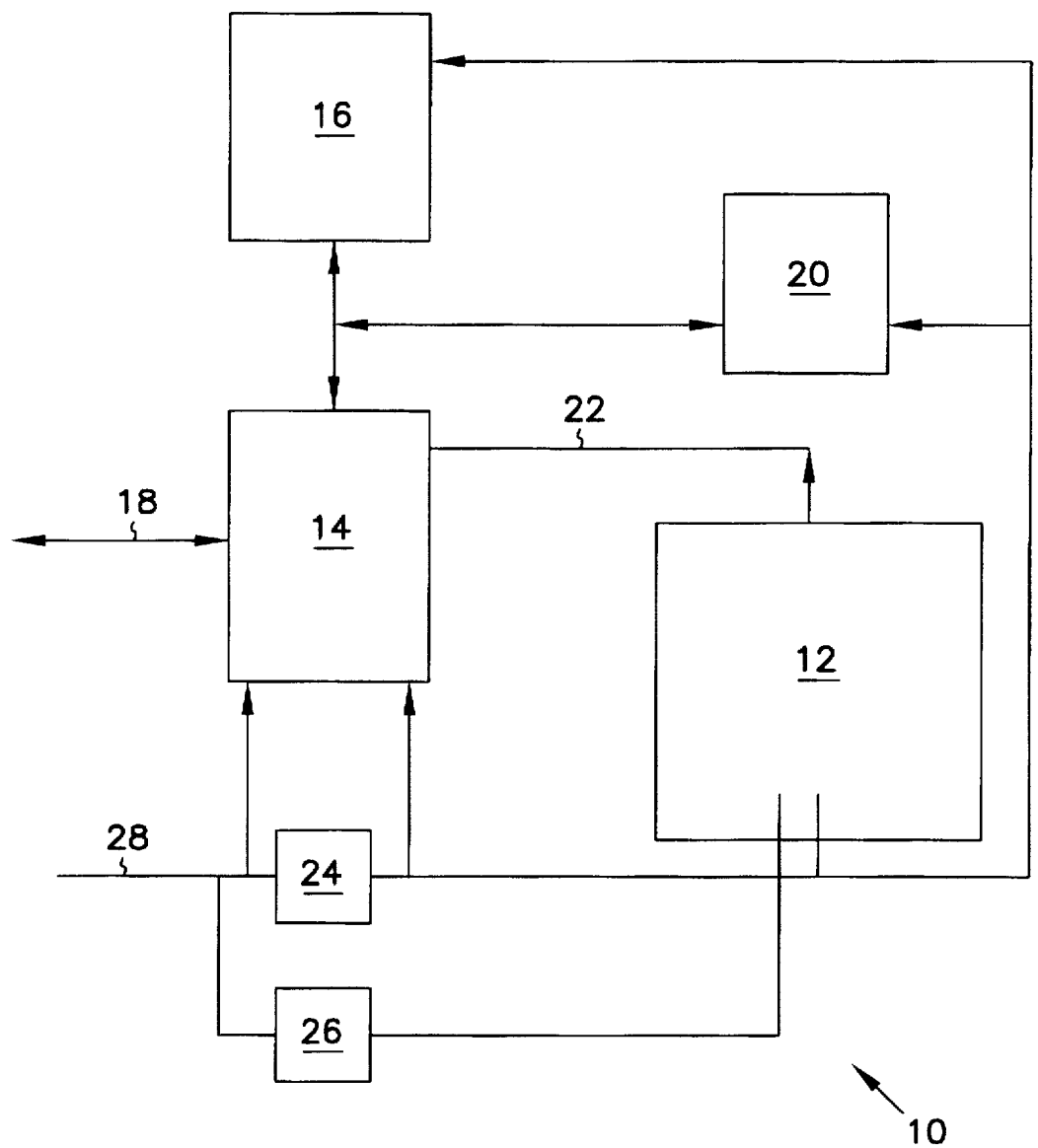
FIG. 1 is a block diagram of a non-volatile memory system which includes the multistate memory programming circuit of the present invention.

Referring to the drawings, FIG. 1 is a block diagram of a non-volatile memory system 10 which includes the multistate programming circuit of the present invention. Memory system 10 includes nonvolatile memory device 12, which is typically in the form of an array of memory cells. The memory cells typically take the form of what are termed "flash" memory cells, although it is understood that the present invention is not, limited to that type of memory cell. The operations of the system, such as the reading, programming, and erasing of the memory cells contained in memory device 12 are controlled by control logic module 14. Control logic module 14 contains, among other circuitry, an internal state machine (ISM) used to sequence the operations performed on the memory cells, buffer memory DMA (direct memory access) control logic, data path control and memory cell I/O, as well a host interface control and microcontroller interface. Control module 14 receives instructions from micro-controller 16 and communicates with a host processor (not shown)via host interface bus 18. It is noted that control module 14 may be designed to include microcontroller 16.

Static random access memory (SRAM) module 20 contains the program implemented by micro-controller 16 for use in controlling the operations of control logic module 14 and memory system 10. This program is typically loaded into SRAM module 20 when system 10 is powered up. SRAM module 20 may also contain look up tables used in managing the files of data stored in memory device 12. Memory device bus 22 is used to send control commands from control logic module 14 to memory device 12, and to exchange the data read from or written to memory device 12 with control logic module 14 and the host processor (via bus 18). Power supply module 24 acts to condition operating voltage 28 to provide the source of the low voltages (approximately 3 volts) used for operating memory system 10. Power supply module 26 similarly conditions voltage source 28 to provide the source of the high voltages (approximately 12 volts) used for programming or erasing the memory cells contained in memory device 12. It is noted that power supply module 26 may be implemented in the form of a charge pump or a dc-to-dc converter whose design is based on inductive principles.

Figure 2:
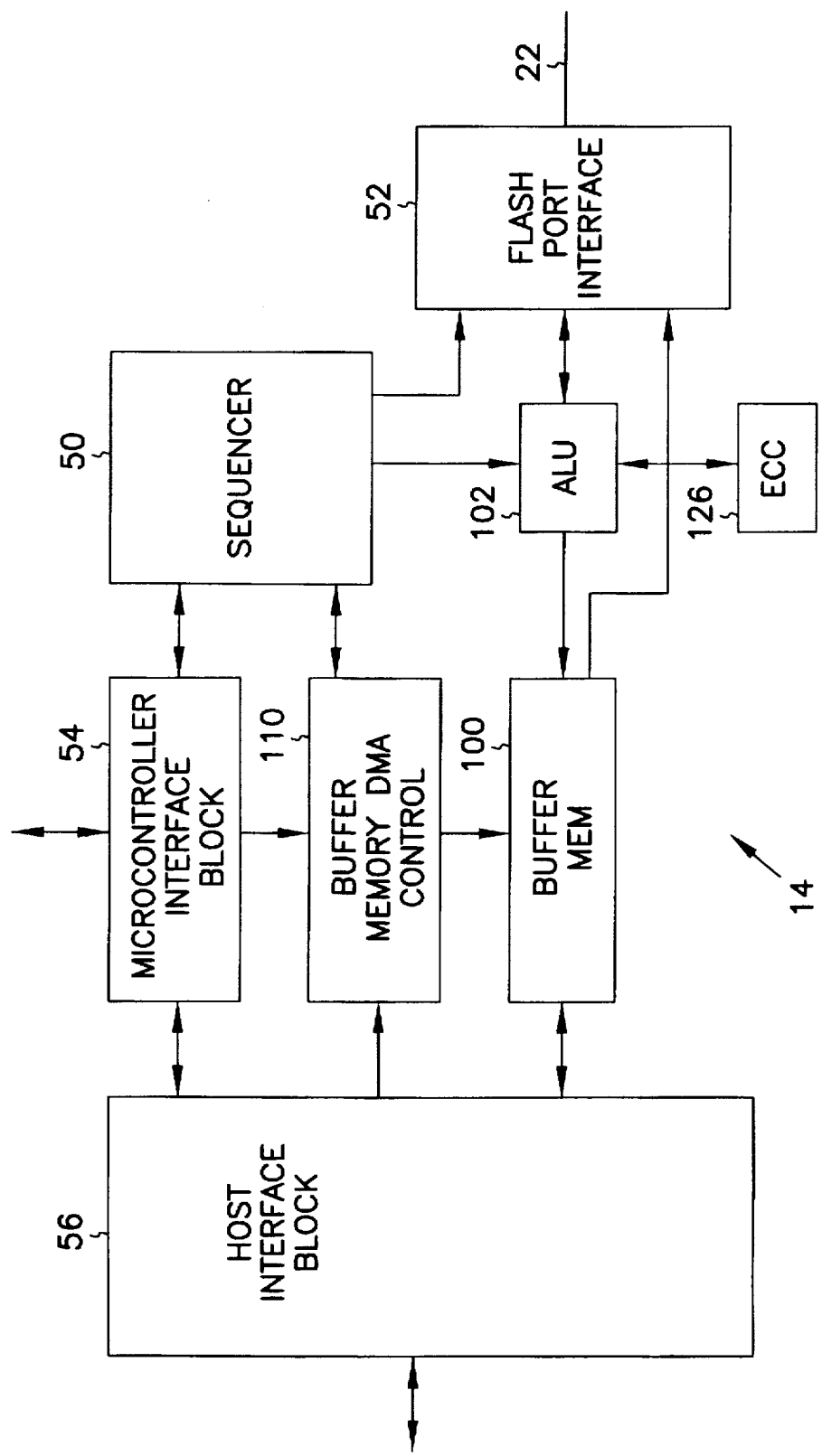
FIG. 2 is a block diagram of the functional units of the control logic module contained in the non-volatile memory system of FIG. 1.

FIG. 2 is a block: diagram of the functional units of control logic module 14 contained in nonvolatile memory system 10 of FIG. 1. The operation of control module 14 is controlled by sequencer 50 which determines the order in which instructions are executed by the control module. The detailed operation of sequencer 50 will be discussed later, with reference to FIG. 6. Control module 14 includes an interface 56 to a host computer and an interface 54 to micro-controller 16 of FIG. 1. The micro-controller bus which is part of interface 54 is used to send and receive information to/from the controller via standard methods. The host interface logic contained in interface block 56 handshakes commands and data over the interface, typically using an address and data bus. Control lines, such as chip selects and read/write strobe controls, determine how the bus information is gated. Control module 14 interfaces to the (flash) memory cells by means of interface 52. Direct memory access (DMA) address generator 110 is responsible for generating the addresses used to access data contained in buffer memory 100 for input to arithmetic logic unit (ALU) 102. ALU 102 performs many of the data processing operations used in the multistate memory programming method of the present invention. Error correcting circuit (ECC) 126 is used for generating check bits during write operations and checking for errors (syndromes) during read operations.

Figure 3:
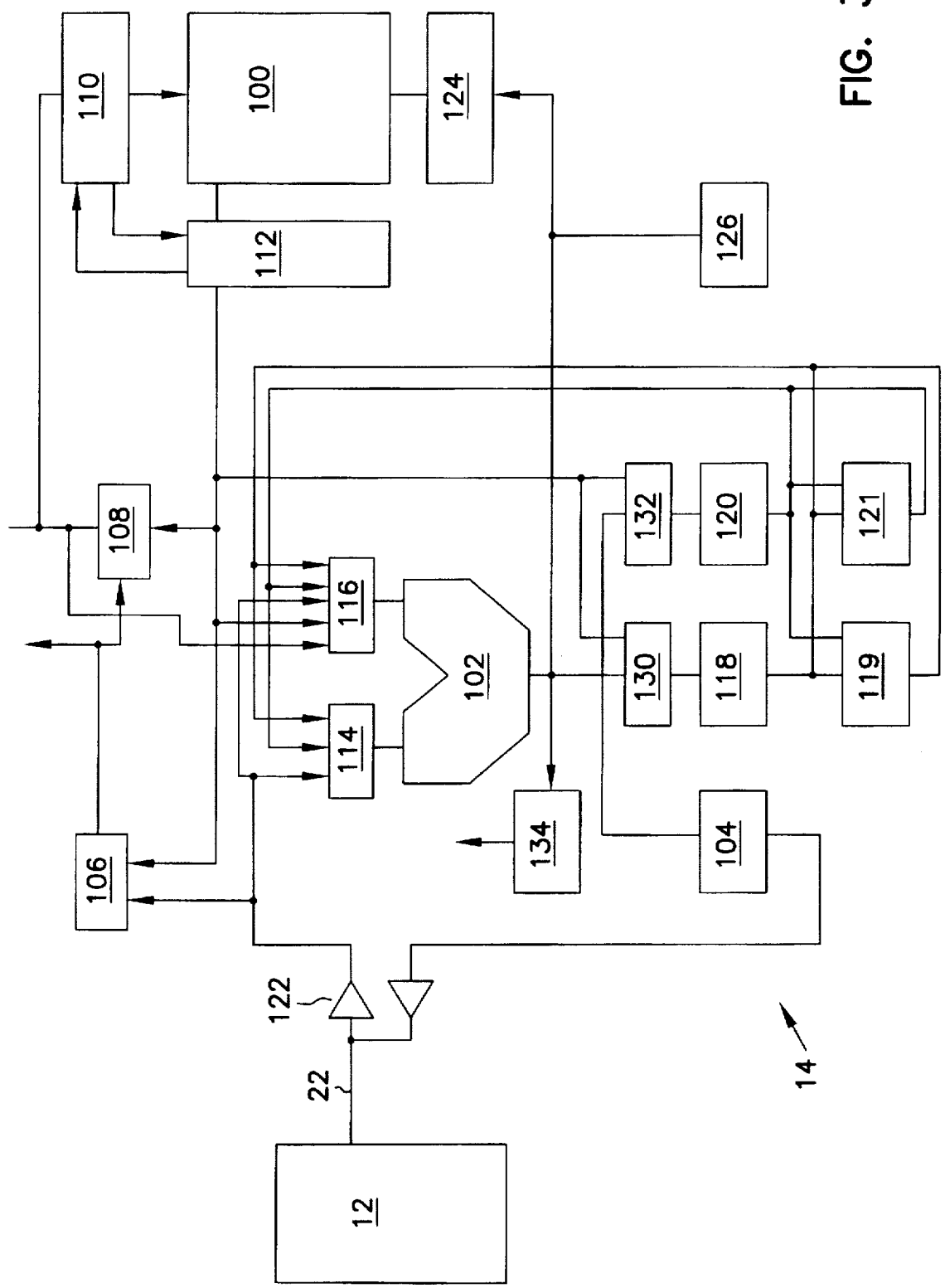
FIG. 3 is a detailed block diagram of the circuitry contained in the control logic module of FIG. 2.

FIG. 3 is a detailed block diagram of the control logic circuitry contained in control logic module 14 of FIG. 2. In the figure, control logic module 14 is shown connected to memory device 12 shown in FIG. 1 via bus 22. Data buffer 100 contains the data which is intended to be programmed into the memory cells of memory device 12. As the data in each memory cell of memory device 12 is read during a read-modify-write cycle of a programming operation, the corresponding data contained in data buffer 100 is also accessed. The two sets of data are compared, a byte at a time, using arithmetic logic unit (ALU) 102. The data read from the memory cell is modified (if required) and written back to the cell. Over-programming detection circuitry 106 is used to determine if a memory cell has been over-programmed to an inoperative state during the programming operation. If a cell has been found to be over-programmed during a stage of the read-modify-write cycle, the contents of the cell is set to a value which prevents further programming of the cell. The structure and operation of the over-programming detection circuitry is described in the U.S. Patent Application entitled "Apparatus and Method for Detecting Over-Programming Condition in Multistate Memory Device" (Attorney Docket MCRN-F2800), Ser. No. 08/736,195, filed Oct. 24, 1996, the contents which is hereby incorporated in full by reference.

As the data programmed into the cells is input from memory device 12 and the intended data is input from buffer memory 100, over-program detection circuitry 106 acts on a byte wide data stream in tandem with the logic operations being performed by ALU 102 and other elements of control module 14. A description of a method for performing these operations is contained in the U.S. Patent Application entitled "Apparatus and Method for Performing Analog Over-program and Under-program Detection for a Multistate Memory Cell" (Attorney Docket MCRN-F5500), Ser. No. 08/736,568, filled Oct. 24,1996, the contents of which are hereby incorporated in full by reference. As noted, ALU 102 assists in executing the data processing operations involved in programming the multistate memory cells.

Figure 4:
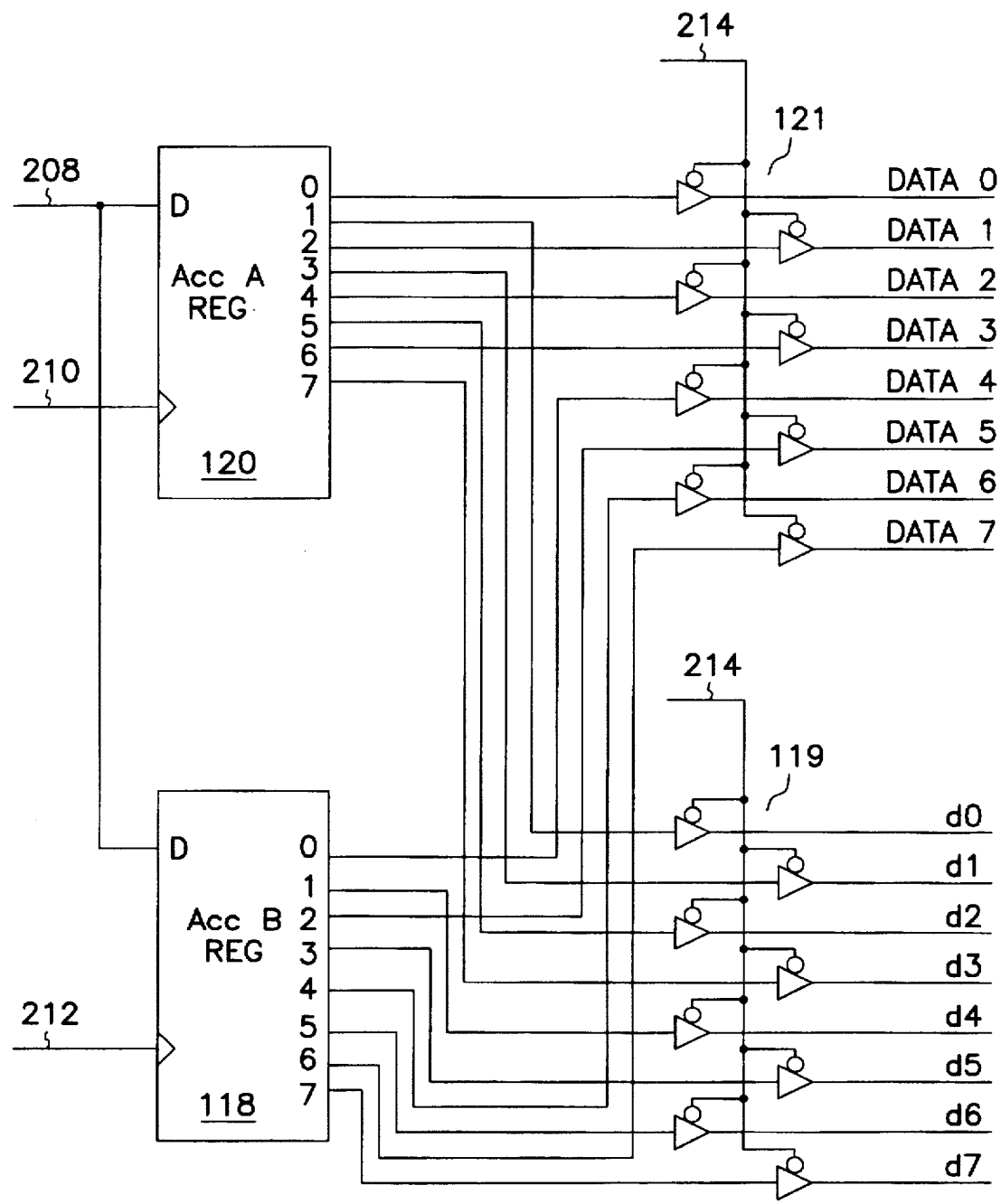
FIG. 4 is a schematic drawing of the data buffer shown in FIG. 3 which is used to rearrange the bits of data into sequences of even and odd-numbered bits.

A detailed description of the hardware and procedure use to accomplish the multistate programming method of the present invention will now be given.
Initial Write Data Transmission FIG. 3 shows the basic blocks required to perform the multistate write operation. The intended programming data is gated from buffer 100, starting at the beginning of a sector of user data stored in buffer memory. Direct Memory Access (DMA) address generator 110 is responsible for accessing the appropriate data from buffer 100. DMA generator 110 works in conjunction with write data pipeline 112 to send data to multiplexers 130 and 132. The two data bytes passed through multiplexers 130 and 132 are loaded into accumulators 118 and 120, respectively. The output from accumulators 118 and 120 are input to buffers 119 and 121, respectively. The details of the data routing for this function will be described later with reference to FIG. 4. The object of this circuit is to separate the even bits from accumulator 118 and 120 into one byte gated by buffer 121. At the same time the odd bits are taken from accumulators 118 and 120 and are gated by buffer 119. The outputs of buffers 119 and 121 are enabled to allow the data (even and odd) to be gated to multiplexers 114 and 116 which further gate the data to the input ports of ALU 102. The even data is input to one ALU port and the odd data is input to the other ALU port. By grouping the data in this manner the bit pairs are input on separate ALU inputs, allowing for ALU operations to be performed on the bit pairs. For the initial operation requiring a conversion of 2 bits to 1 (the collapsing operation), the ALU function select will be set so ALU 102 performs an AND operation. This function is set by the sequencer (FIG. 2, block 50) which loads a register making the ALU AND function active. The AND function operates on one bit from each part producing an output for that pair. For the data presented, all data outputs will be zero except for input pairs that are both ones (1 1), which will be output as a single (1) bit. At this point the two bytes of data taken from buffer 100 have been collapsed and are ready to be sent to the memory cells. The collapsed data (transformed) is loaded into output register 104 which in-turn sends the data to the output transceiver 122. The data is sent over flash bus 22 and input to flash memory device 12. The collapsed data loaded into device 12 write data registers will determine which cells are programmed, based on the value in the register (1 or 0). A "0" value will permit programming and a "1" value will prevent programming by the high voltage program pulse applied during a programming sequence. The above sequence is repeated 32 times in the controller for an effective transfer of 256 bits. After the data registers are loaded, the program pulse operation is activated, causing memory cells to be driven to a 0 value by its corresponding data register.
Programming Sequence The programming operation is a command that enables a high voltage pulse to be applied to the cells whose data registers contain data having a value of "0". The pulse is set to have a short duration that is optimized to produce a change of one threshold voltage state ($V_{th}$ level) in the memory cells.
Program and Verify Sequence The program and verify sequence starts by having the controller do a read of the data programmed into a memory cell. With reference to FIG. 1, a read operation for retrieving data from a memory cell of device 12, consists of sending the starting address of the desired cell from micro-controller 16 to memory device 12, and then strobing the data read from the addressed cell into control module 14. The read data is provided on bus 22 and received by transceivers 122. The incoming data is received by over program detection module 106 and ALU multiplexer 114 or 116, as determined by sequencer control bits. The data received is then input to ALU 102. At the same time that the data was read from the memory cell and gated to a port on the ALU, the sequencer activated DMA module 110 to address buffer memory 100, which fetches the intended data corresponding to that which was programmed into the cell and just read back. This data output from buffer 100 is clocked into pipeline register 112. The output of register 112 is then gated through multiplexer 114 or 116 (as selected by the sequencer) and input to the opposite port of ALU 102 as the data read from the memory cell. The two bytes of data (from the cell and the buffer memory) are then compared to see what bits compare. This is done by having the sequencer set the ALU to perform an exclusive NOR (XNOR) operation between ALU ports A and B. The resultant output of this operation will force bit pairs that are the same value on the input to generate a corresponding "1" at the ALU output. Likewise, all non comparing inputs will result in the ALU output being set to "0". This output will be gated through multiplexer 132 and will be loaded in accumulator register 120. Following this register load, the controller will repeat a read fetch from the memory cell at the same time fetching the next compare byte from buffer memory 100. Again the two bytes will be exclusive NOR (XNOR) by ALU 102. This time the ALU output will be stored in the companion accumulator register 118. At this point the two accumulators contain a word of memory that is ready to be collapsed (transformed) and be sent back to the memory cells for a write data load operation. This part of the procedure involves the use of odd/even registers 119 and 121. The controller sequencer will select registers 119 and 121 as the input sources to ALU 102. The sequencer will also switch the ALU to an AND function so the bit collapsing operation described earlier will result in the two input bytes being reduced to one input byte, which will be loaded into output register 104 and bus 22 via output drivers 122, thereby inputting data into memory device 12 write registers. At this point one cycle of the multistate write verify sequence has been completed. The cycle consists of doing a read compare, read compare write collapse, and write data back to the memory write data holding registers. This cycle is repeated for all the data in a write packet. After all the data is read-in, modified and written back to the memory cells in this manner, the packet of data is ready for another program pulse sequence. The programming sequence causes high voltages to be applied to memory cells whose corresponding data registers are loaded with data having values of 0. As before, the program pulse is set to an amplitude and pulse duration that will allow the data bits that are set to 0 to obtain enough change in the floating gate to move the memory cell to the next higher $V_{th}$ level. The program pulse can also be set to an amplitude and pulse duration such that more than one pulse is needed to reach the next threshold voltage level.

After the program sequence is complete the controller will again repeat the multistate write verify cycle (read-modify-write). The sequencer will repeat the program and write verify cycle until all data has obtained its proper state, whereby the multistate program operation is complete. It should be noted that programming is considered done when all collapsed bits (transformed data) sent to flash have obtained value of 1. At this point no further programming will be done. If after a programming pulse a location is over-programmed, circuit block 106 would detect this condition and interrupt the programming sequence. This process is described in the previously mentioned application entitled "Apparatus and Method for Detecting Over-Programming Condition in Multistate Memory Device".

EXAMPLE OF METHOD OF PRESENT INVENTION

The following discussion expands upon the previous description and shows detailed examples of the data bit manipulations, indicating how the data is adjusted on a step by step basis to achieve the desired final results.

For a multistate memory cell having four states, the two data bits are represented by a threshold voltage level or state of the multistate memory cell. The four possible states are shown in the following table, in order of lowest to highest $V_{th}$:

| Bit 1 Value (IB) | Bit 0 Value (IA) | State |
|---|---|---|
| 1 | 1 | Erased |
| 1 | 0 | First Programming |
| 0 | 0 | Second Programming |
| 0 | 1 | Third Programming |

Note that this is but ore example of a possible encoding scheme for a four state cell. Other encoding methods could be used with adjustments in the circuits to reflect these changes. The above code is used because it assists with error correction. This is because a state that is off by one value when being read would result in a single bit error, instead of a two bit error which could result using a non-gray coded scheme. By adjusting the encoding scheme to reflect the most likely programming errors, errors in which the programmed state is one state off on read operations, will result in a one bit error instead of two.

The programming method of the present invention will now be described by reference to an example in with the data intended to be programmed is given by: 1 0; 0 1; 1 1; 0 0 (referred to as bits Ih Ig; If Ie; Id Ic; Ib Ia). This represents 4 pairs of two-bit data, or one byte of data which is contained in four memory cells. The least significant bit (LSB) is on the right and the most significant bit (MSB) is on the left. In order to program the data, control module 14 collapses each bit pair into either a one or a zero.

The data is collapsed to a one if both bits of a bit pair are a one, and to a zero otherwise. Thus, because the data (1 1) represents an erased state, any situation in which the pair of bits is programmed will be collapsed to a value of zero. During each iteration of the verify cycle, the collapsed data serves as a gating function to the high voltage pulse generator of the memory system, with programming being performed on the corresponding bits when a zero is present and no further programming being performed when a one is present. Based on the rule discussed, the collapsed data for the data intended to be programmed would be as follows:

$$1\ 0 \Rightarrow 0;\quad \text{Bit 3}$$
$$0\ 1 \Rightarrow 0;\quad \text{Bit 2}$$
$$1\ 1 \Rightarrow 1;\quad \text{Bit 1}$$
$$0\ 0 \Rightarrow 0.\quad \text{Bit 0}$$

Thus, after the collapse operation, the data listed above would be sent to the memory as 0 0 1 0. This represents collapsed bit data (2 bits to 1 bit) for four memory cells, each containing a pair of two-bit data. As is shown, bits zero, two, and three have collapsed data represented by zero, while bit one has collapsed data represented by a one. In accordance with the definition of a programming instruction discussed, cells zero, two, and three will be subjected to programming. After the data collapsing operation and loading of data into the memory cell data register, the memory system internal logic will be set to enable a high voltage programming pulse on bits zero, two and three.

Note that it is assumed that each cell is originally in an erased state. The pulse voltage and duration of the programming pulse is sufficient to take bits from an erased state (1 1) to the first programming level (1 0), i.e., from the present threshold voltage level (erased) to the next highest level. Control module 14 then causes the data contained in the four memory cells to be read back. The data read back would now have the form:

1 0; 1 0; 1 1; 1 0.

Note that bits pair zero, two, and three are in the first programming level (1 0), while bit pair one contains the data originally in the bit (1 1). The data read back from the cells is then exclusively NORed (XNOR) with the data intended to be programmed into the cells. The result of this XNOR operation is:

```
1 0; 0 1; 1 1; 0 0 intended data
1 0; 1 0; 1 1; 1 0 read back data 1 1; 0 0; 1 1; 0 1 XNORed data
```

The XNORed data is then collapsed as previously described to produce the following:

```
1 1 ⇒ 1;  Bit 3
0 0 ⇒ 0;  Bit 2
1 1 ⇒ 1;  Bit 1
0 1 ⇒ 0.  Bit 0
```

Thus, after the collapse operation, the control data provided to the memory would be 1 0 1 0. In accordance with the programming instructions described, the cells corresponding to bits one and three will not be subjected to any further programming, while the cells corresponding to bits zero and two will be subjected to further programming. Control module 14 then causes the data contained in the four memory cells to be read back. The data read back would now have the form:

1 0; 0 0; 1 1; 0 0.

The read back data is then exclusively NORed (XNOR) with the data intended to be programmed into the cells. The result of this XNOR operation is:

```
1 0; 0 1; 1 1; 0 0 intended data
1 0; 0 0; 1 1; 0 0 read back data 1 1; 1 0; 1 1; 1 1 XNORed data.
```

The XNORed data is then collapsed as previously described to produce the following:

```
1 1 ⇒ 1;  Bit 3
1 0 ⇒ 0;  Bit 2
1 1 ⇒ 1;  Bit 1
1 1 ⇒ 1.  Bit 0
```

Thus, after the collapse operation, the control data provided to the memory would be 1 0 1 1. In accordance with the programming operation, the memory cells corresponding to bits zero, one, and three will not be subjected to any further programming, while the cell corresponding to bit pair two will be subjected to any further programming.

The memory system generates a high voltage programming pulse to be applied to the memory cell corresponding to bit two. The pulse voltage and duration of this programming pulse is sufficient to take the cell from the second programming level (0 0) to the third programming level (0 1).

Control module 14 then causes the data contained in the four memory cells to be read back. The data read back should now have the form:

1 0; 0 1; 1 1; 0 0.

This data us then exclusively NORed (XNOR) with data intended to be programmed into the cells. The result of this XNOR operation is:

```
1 0; 0 1; 1 1; 0 0 intended data
```

-continued
```
1 0; 0 1; 1 1; 0 0 read back data
```

1 1; 1 1; 1 1; 1 1 XNORed data.

The XNORed data is all ones, indicating that the programmed data now matches the intended data. Thus, no further programming is required.

From the above description it has been shown that iterative program verify sequences within the controller results in data being programmed to its intended state, at which time the compare operation will take it out of the program operation freezing the cell at its desired state.

The multistate memory cell programming method of the present invention is base on an iterative cycle of:

(1) collapsing the data, Anding, and sending it to the memory;

(2) programming the memory using a high voltage sequence;

(3) reading data programmed into a memory cell;

(4) comparing the read data to the data intended to be programmed into the cell;

(5) operating on the result of the comparison to produce a set of control bits which identifies the cells which require further programming;

(6) sending the modified and collapsed bits back to the memory cell;

(7) applying a programming pulse to the cells requiring additional programming to alter the threshold voltage of those cells; and (8) repeating steps 2 through 7 until all read data compares and the collapsed data sent to the memory cell is all 1's or until the maximum program cycle count, is reached.

During each programming cycle, the duration and amplitude of the programming pulse is set to cause the threshold voltage of a memory cell to change from one state to the next highest state. Thus, the parameters of the programming pulse are optimized for each cycle, with the amount of charge transferred to the control gate of the cell being sufficient to alter the threshold voltage level to the next highest state. This reduces the number of programming pulses required to program the memory cells with the intended data compared to a method in which a pulse of the same amplitude and duration is used repeatedly.

The programming cycle is repeated until the data read back from the memory cell matches that intended to be programmed into the cell. The controller has the capability of modifying the high voltage pulse applied by loading different values into the memory device via the interface. In addition, the sequencer has the ability to vary the time interval through its firmware executed internal to the controller (sequencer). With these capabilities of variation, the controller can optimize the programming operation within the memory device to produce results best suited for the program operation. The optimization method for moving between different pairs of states will not be identical. To address these differences the controller has built in the flexibility to alter the programming parameters, depending on which state to state transition the memory cell is being requested to traverse. By having a controller support such an optimized programming operation, close to ideal state transition with minimal programming may be obtained. The controller can be implemented to have the ability to alter these programming parameters based on the type of memory device and memory cell block being programmed.

The previous description of the multistate memory cell programming method of the present invention was directed to the programming of one byte (eight bits, or four memory cells). To operate properly over an 8 bit data bus used in this implementation the controller will collapse 16 bits to 8 bits on writes. During the read portion of the write verify sequence, 2 bytes are read so the write portion will be done as a full byte transmission.

The following sections describe a full data path usage as would occur in a preferred embodiment of this invention. The write to the memory cell is started with a fetch of data from the buffer memory. The data taken from buffer memory 100 is passed through pipeline register 112 and is gated to multiplexers 130 and 132 directly.

The output of these: two multiplexers pass this data to accumulators 116 and 120, respectively. The data out of these two accumulators are routed in the manner shown in FIG. 4. Buffer 119 and 121 inputs collect the odd and ever. bits from register 118 and 120. The output of these two registers are made active by the sequencer, with the even and odd bits being gated to multiplexer 116 and 114. The output is passed through to the inputs of ALU 102. For the write data loading the PLU 102 function set by the sequencer will be an AND of the inputs at the two ports. The output of ALU 102 will then represent the result of the ANDing of the bit pairs. The AND value output will convert each bit pair to the collapsed byte value loaded into register 104 and sent to memory device 12 via interface buffers 112 and bus 22. The load of the buffer data to the memory consists of repeated buffer reads and collapsing of data, then being sent to the cells. After all the data buffers have been loaded into the memory cells, a high voltage program sequence is generated for that state transition. Following the program operation, the ALU function is switched to an exclusive NOR (XNOR) and the data just partially programmed is read back into the controller for modification. The controller will perform two reads from the memory cells and the buffer memory. This data will be modified and stored in accumulators. The modified data will then be collapsed by passing the modified (compared) data through an odd-even register forcing a collapse by the AND function. The process is repeated in two byte pairs until the programmed data in a packet has been acted upon. The program cycle followed by the verify is repeated until all program data from memory matches the intended data, completing the program operation.

The verify cycle for the two byte pairs will now be described. The controller will read a byte of data from memory device 12, bringing this byte of data into the controller via bus 22 and receivers 122. The data is input to one of the ALU ports via either multiplexer 114 or 116. At the same time, the original data intended to be programmed into the memory cells in gated out of buffer 100 and passed through pipeline 112. The data is input to multiplexer 114 or 116, opposite the path selected for the incoming data, the intended data ending up as the other input to ALU 102. ALU 102 now functions to perform an exclusive NOR (XNOR), comparing the data and generating a 1 for the bits that compare and a 0 for the bits that do not compare. The result and output of this first byte compare is loaded into accumulator 120. The controller then reads the next byte from the memory cells, as well as the next byte from buffer memory 100. The same compare sequence is repeated, with the resultant output being stored in accumulator 118. ALU 102 logic function is switched to perform an AND operation at the same time the odd/even registers 119 and 121 are selected as the source to ALU 102. The resultant output of ALU 102 contains the collapsed bits of the two bytes of data operated on. This collapsed byte is loaded into register 104 and sent to memory device 12 via output drivers 122 and bus 22. This two byte sequence is repeated for all the bytes in a program packet. After this, the modified, data will be loaded back into the memory cells and will be subjected to another program cycle. Following this, the program verify cycles will be repeated and the program cycles will be repeated until all data obtains its desired value, as indicated by comparison with the contents of buffer 100.

The operation of the circuitry of FIG. 2 in implementing the multistate programming method of the present invention on two bytes of data in parallel will now be discussed. Based on the previous explanations of how the data is manipulated for a byte and how the hardware is used to perform the program operation and program verify, a full two byte cycle can be described. To shorten the description the full program and program verify sequence will be described in terms of two bytes of data and not a full data packet. To start the initial multistate programming operation, a word of data (16 bits) will be taken from buffer memory 100 and will be loaded into accumulator registers 118 and 120 as previously described. Assume the data is as shown below:

01 00 10 11 11 10 00 01

The LSB byte (11, 10, 00, 01) will be loaded in register 120, and the MEB (01, 00, 10, 11) will be loaded into register 118. The output of even register 121 will be 10, 01, 10, 01, while the output of odd register 119 be 00, 11, 11, 00. Inputting these two values to the ALU, and performing an AND function will result in an output from ALU 102 of 00 01 10 00 being loaded into register 104 and sent to device 12 via buffers 122 and bus 22. A program pulse will be given, driving all data loaded with a 0 to the first program state. The data is then read back with two bytes transferred over the interface. The first byte (LBS) will be read out as 11 10 10 10. This resulted from the bits being programmed from the 11 to the 10 state and the one bit not being programmed leaving that cell in the 11 state. This data is compared with the intended data taken from buffer 100. The data is compared by an exclusive NOR (XNOR) function in ALU 102. The compare operation is shown below:

| | |
|---|---|
| 11 10 00 01 | Original |
| 11 10 10 10 | Data Read Back (1 pulse) |
| 11 11 01 00 | XNOR Compare |

The resultant compare value is loaded into accumulator register 120. The MSB is now read from memory. Its readback value is 10 10 10 11. This value is input to ALU 102 and XNOR compared with the intended data from buffer memory 100. The result of the XNOR compare is shown below and is stored in register 118.

| | |
|---|---|
| 01 00 10 11 | Original |
| 10 10 10 11 | Data Read Back (1 pulse) |
| 00 01 11 11 | XNOR Compare |

At this point the ALU function is changed to an AND and the outputs of even/odd registers 121 and 119 are selected as the ALU data source. The register values are shown below along with the collapsed (AND) output from the ALU.

| | | |
|---|---|---|
| EVEN | 0 1 1 1 1 1 1 0 | Even (121 output) |
| ODD | 0 0 1 1 1 1 0 0 | Odd (119 output) |
| AND | 0 0 1 1 1 1 0 0 | ALU AND output |

This data is loaded into output register 104 and sent to memory device 12 via drivers 122 and bus 22.

A program sequence to move the cells set to data bit zero is initiated in the memory device. At the end of the program sequence the data is again read back as before. The result operations described previously are repeated and the resultant data is shown below:

```
LSB READ
11 10 00 01    Original
11 10 00 00    Data Read Back (2nd Pulse)

MSB READ
01 00 10 11    Original
00 00 10 11    Data Read Back (2nd Pulse)

EVEN/ODD COLLAPSE
0 1 1 1 1 1 1 0    Even Register 121
1 1 1 1 1 1 1 1    Odd Register 119
```

The data is sent to flash as before. A program sequence to move cells set to 0 to the next state is imitated. Following this 3rd program sequence the data is read as before, with the resultant operations shown below.

```
LSB READ
11 10 00 01    Original Data
11 10 00 01    Data Read Back (3rd Pulse)

MSB READ
01 00 10 11    Original Data
01 00 10 11    Data Read Back (3rd Pulse)

EVEN ODD COLLAPSE
1 1 1 1 1 1 1 1    Even Register
1 1 1 1 1 1 1 1    Odd Register
```

At this point the data to be programmed has been transferred and the programming operation for the example is complete; however, the controller must detect this condition and halt the sequence for the packet of data being programmed. The controller will check to see if the collapsed data being sent to the memory cells is all ones. When such a data state is detected, the program operation is complete with no further action required for that data packet.

Figure 5:
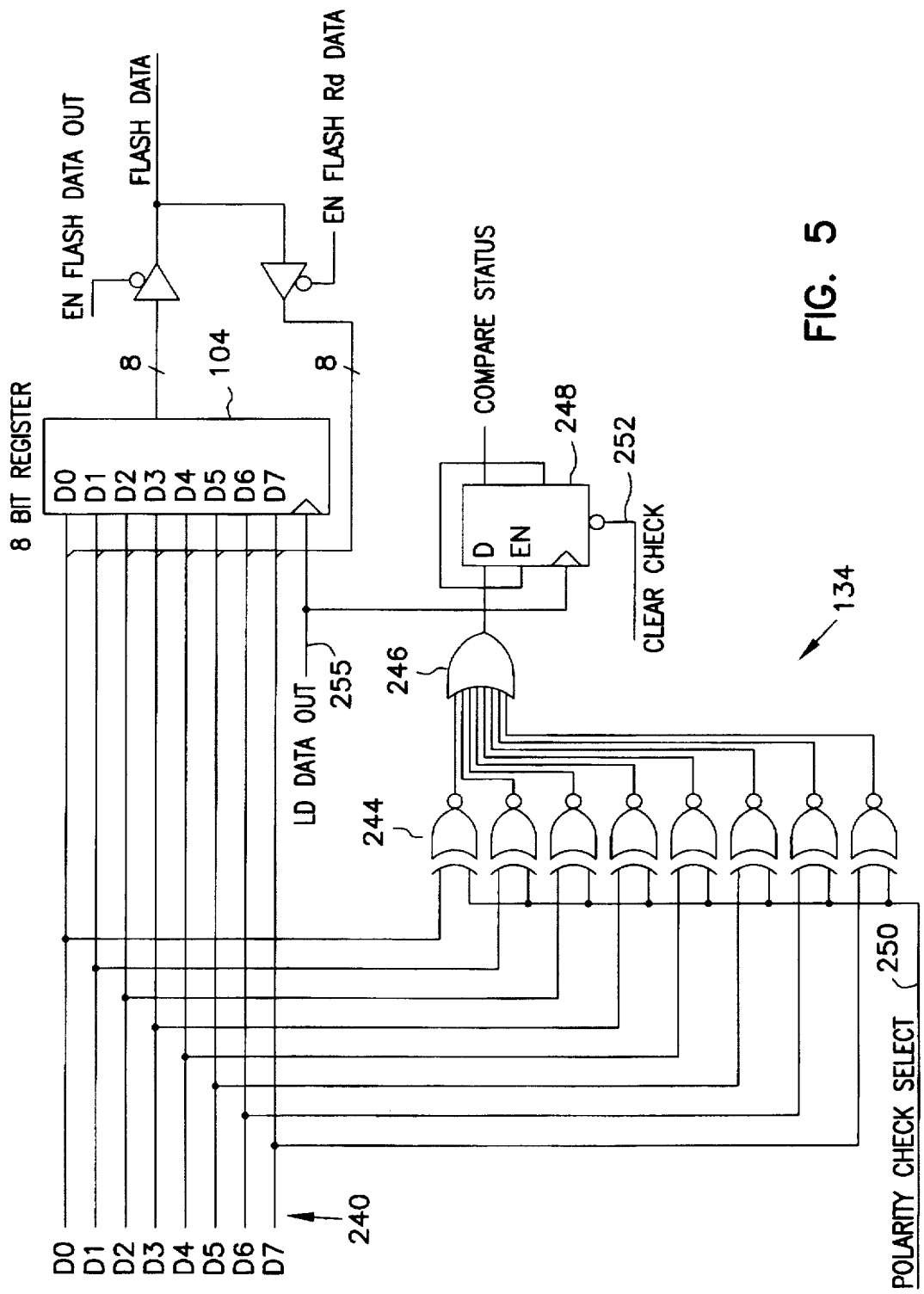
FIG. 5 is a schematic drawing of the one-zero detection circuitry used| in the multistate programming apparatus and method of the present invention.

The determination of whether the programmed data matches the intended data is streamlined by the use of ones-zeros detect logic module 134, a schematic of which is shown in FIG. 5. The circuit of module 134 determines whether the output of ALU 102 is either all ones or all zeros. At the end of each read-modify-write cycle, a status bit in module 134 is checked to see if further high voltage programming operations are required.

As shown in FIG. 5, data input lines 240 (labelled lines D0 to D7 in the figure) representing the output of ALU 102 are provided as inputs to 8 bit data register 104 and to a set of logic gates 244. In the circuit of FIG. 5, logic gates 244 are implemented in the form of exclusive NOR (XNOR) gates. The inputs to the XNOR gates are one of the data input lines 240 and a polarity check select signal 250. Polarity check select signal 250 controls the operation of the circuit of FIG. 5 to determine whether the circuit detects if the data input by means of data input lines 240 is either all ones or all zeros. Polarity check select signal 250 is set by the action of setting or clearing a control register (not shown). The outputs of XNOR gates 244 are provided as inputs to OR gate 246. If polarity check select signal 250 is set low (indicating that the logic is looking for a logical value of 1 for all input data to indicate completion of the programming operation), then if the signals on data lines 240 all correspond to a logical value of one, all of the outputs of XNOR gates 244 will be low. The output of OR gate 246 will then be low. If one or more of the signals on data lines 240 corresponds to a logical value of zero, then the output of at least one of XNOR gates 244 will be high and the output of OR gate 246 will be high. This serves to indicate that the programming operation has not been completed.

If the controller is looking for a data pattern of all zeros, the control signal is set to a logic high polarity. In this case an all zero data value on bus 240 will by XNORED with the logic high polarity select. If all signals are zero the output of gates 244 will be a logic low and the output of OR gate 246 will also be a logic low. If any of the data bits are not a logic low, its XNOR gate will go positive, as will OR gate 246 indicating a miscompare.

A high value for the output of OR gate 246 during compares acts as a set input for register 248. When data clock signal 255 goes high, register 248 becomes set, at which time the enable goes inactive, thereby holding the register in the set state. This acts to prevent any further clocking of the register. At the end of the read-modify-write sequence, the state of register 248 is checked. If register 248 is set, then further programming of the data byte or packet is required. At the end of each packet transmission, the controller will generate a "clear check" 252 signal that will reset register 248. This will allow its use during the next packet evaluation.

Figure 6:
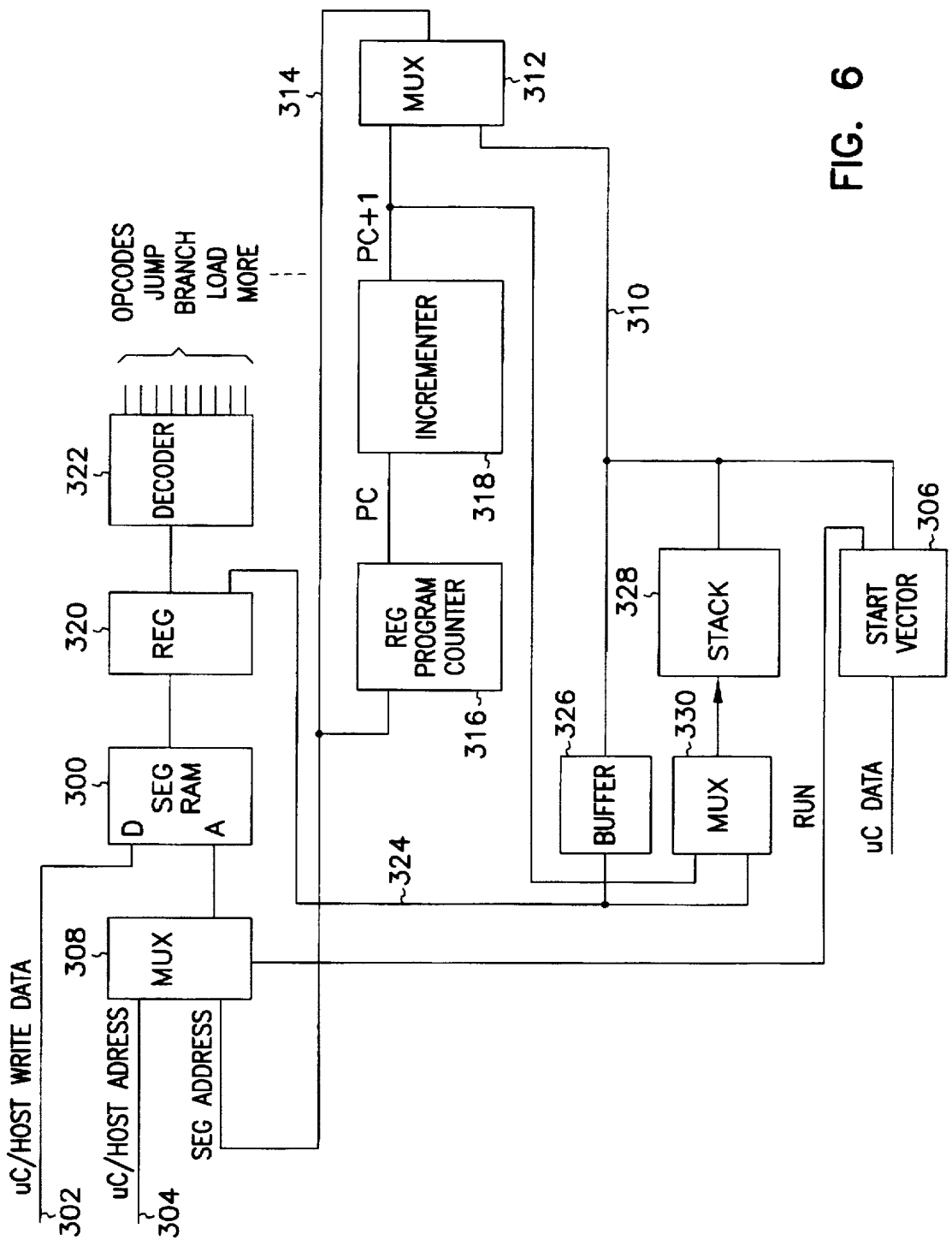
FIG. 6 is a block diagram of the sequencer shown in FIG. 2 which is used to control the operation of the control logic module.

FIG. 6 is a block diagram of sequencer 50 used to control the operation of control logic module 14 of FIG. 2. Sequencer 50 uses a random access memory (RAM) module 300 to provide greater flexibility than is found in controller architectures which utilize read only memory (ROM) for the storage of control commands. When the system is powered up, RAM module 300 is loaded through the microcontroller (element 54 of FIG. 2) or host (element 56 of FIG. 2) interface, which are identified by data lines 302 and 304 in FIG. 6. Data lines 302 and 304 carry the data to be loaded into RAM module 300. Once this data is loaded the operating code within the RAM is ready for operation.

Sequencer 50 is started by having the microcontroller write a value into start vector block 306. The data value loaded into start vector block 306 is used as the starting address for the sequencer's operation. Upon loading a register contained in start vector block 306, the logic in the block sets a "run" signal which turns off the address data source contained in the host or microcontroller. This causes the data loaded into start vector block 306 to be the source of the address applied to RAM module 300 via logic multiplexer 308. Start vector block 306 outputs this address data onto vector bus 310. The address data is gated through multiplexer block 312 onto sequencer address bus 314. The address is passed through multiplexer 308 to provide the address source for RAM module 300. The output of RAM module 300 contains the first instruction to be executed by sequencer 50.

The address data provided to RAM module 300 is also captured in register block 316. Register 316 functions as the sequencer program counter. The output of program counter 316 is supplied to incrementer block 318 which adds 1 to the value of its input. The output of incrementer 318 represents the address of the next sequential instruction to be fetched, if selected by the present operations "opcode".

While program counter 316 and incrementer 318 are operating, the output of RAM module 300 is operating in parallel. The output of RAM module 300 is stored in instruction register 320. The output of instruction register 320 is input to instruction decoder block 322. Instruction decoder 322 is responsible for determining the function to be performed, based on the contents of the instruction register. The functions performed are typically to load a register, move data, or test bits. Each instruction decode determines the source of the address for the next instruction. The incremented value of the program counter (indicated by the label PC+1 in the figure) is selected when the next sequential instruction is to follow the present one being executed. In this case multiplexer 312 selects the PC+1 value and places it on sequencer address bus 314. This value is input to multiplexer 308 and passed to RAM module 300 where it serves as the address of the next opcode. If the instruction being executed requires a jump or branch operation, the address of the jump or branch is contained as part of instruction register 320. This data is transferred by means of jump/branch address bus 324. The data contained on jump/branch address bus 324 is gated through tri-state buffer 326 and then gated onto vector bus 310. The data is passed through multiplexers 312 and 308 and is input to RAM module 300 for the next instruction opcode fetch. In order to provide a more flexible sequencer, it is desirable to be able to operate with subroutines. To provide this capability, stack block 328 is used. When a subroutine call instruction is executed, sequencer 50 will jump to a new address in the manner described. In addition to this procedure, the next sequential address, pointed to by register 318, is saved in stack block 328. This is done by having the PC+1 address value sent through multiplexer 330. This address value is then stored in registers contained in stack block 328. Once this address is saved, sequencer 50 continues to operate at the new address indicated by the branching address. When the program wishes to return from the subroutine and begin executing at the location branched from, a return from subroutine instruction is executed (RTS). This causes stack block 328 to gate the saved address onto vector bus 310, and through multiplexers 312 and 308 into RAM module 300 address input. This causes sequencer 50 to begin executing the operation at the desired address.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method for programming a multistate memory cell, comprising:

reading data contained in a multistate memory cell, wherein the memory cell contains a pair of data bits;

comparing the data read to data intended to be programmed into the cell, an output of the comparison operation being a one if a bit of the data read properly compares to a corresponding bit of the data intended to be programmed and zero otherwise;

generating a programming operation instruction to cause further programming of the cell when a result of the comparison step indicates that the data read does not properly compare to the intended data by collapsing each pair of data bits contained in the output of the comparison step to a value of one if both bits are a one, and to a value of zero if either bit is a zero;

generating a programming pulse for the memory cell in response to the programming operation instruction by operating a programming voltage pulse generator when the data read does not properly compare to the intended data; and repeating the steps of the method until the comparison step indicates that the data read from the memory cell properly compares with the intended data.

2. The method of claim 1, wherein the step of comparing the data read to the data intended to be programmed into the cell, further comprises:

performing an exclusive NOR (XNOR) operation between the data read from the memory cell and the intended data.

3. The method of claim 1, further comprising:

controlling the programming voltage pulse generator to produce a programming pulse if the value of the collapsed pair of data bits is a zero.

4. The method of claim 1, wherein the memory cell includes a plurality of data storage states, and further, wherein the step of generating the programming pulse for the memory cell further comprises:

generating a programming pulse having an amplitude and duration sufficient to cause the memory cell to change from a first data storage state to a second data storage state.

5. The method of claim 4, wherein the second data storage state is the next highest state after the first data storage state.

6. The method of claim 1, wherein the step of collapsing each pair of data bits contained in the result of the comparison step, further comprises:

performing an AND operation between the bits of each pair of data bits.

7. A multistate memory system, comprising:

an array of multistate memory cells, wherein each memory cell contains a pair of data bits;

a memory cell read module for reading data contained in a memory cell of the array of multistate memory cells;

a storage module for storing data intended to be programmed into the memory cell;

a comparator for comparing the data read from the multistate memory cell to the data intended to be programmed into the cell, wherein an output of the comparator is a one if a bit of the data read properly compares to a corresponding bit of the data intended to be programmed and zero otherwise;

a programming instruction generator for generating a programming operation instruction to cause further programming of the multistate memory cells when the data read from the cell does not properly compare to the data intended to be programmed into the cell by collapsing each pair of data bits contained in the output of the comparator to a value of one if both bits are a one, and to a value of zero if either bit is a zero; and a programming pulse generator which generates programming pulses for the memory cell in response to the programming operation instruction.

8. The multistate memory system of claim 7, wherein the comparator for comparing the data read to the data intended to be programmed into the cell performs an exclusive NOR (XNOR) operation between the data read and the data intended to be programmed into the cell.

9. The multistate memory system of claim 7, wherein the programming instruction generator performs an AND operation between the bits contained in each bit pair of the output of the comparator.

10. A method for programming a multistate memory cell, comprising:

accessing data intended to be programmed into the memory cell;

generating an initial programming instruction by collapsing a pair of data bits in the data intended to be programmed into the memory cell to a single bit;

applying a programming pulse to the memory cell in response to the initial programming instruction;

reading the data programmed into the memory cell;

comparing the data programmed into the memory cell to the data intended to be programmed into the memory cell;

generating a further programming instruction for the memory cell when the data programmed into the memory cell does not properly compare to the data intended to be programmed into the memory cell;

applying a programming pulse to the memory cell in response to the further programming instruction; and repeating the previous steps as necessary until the data programmed into the memory cell properly compares to the data intended to be programmed into the memory cell.

11. The method of claim 10, wherein the step of generating an initial programming instruction further comprises:

performing an AND operation on the pair of data bits; and generating an initial programming instruction to program the memory cell when a result of the AND operation is a zero.

12. The method of claim 10, wherein the step of comparing the data programmed into the memory cell to the data intended to be programmed into the memory cell further comprises:

performing an exclusive NOR (XNOR) operation between the data programmed into the memory cell and the data intended to be programmed into the memory cell to produce a XNOR result having a plurality of data bits.

13. The method of claim 12, wherein the step of comparing the data programmed into the memory cell to the data intended to be programmed into the memory cell further comprises:

performing an AND operation between the data bits of each pair of data bits contained in the XNOR result.

14. The method of claim 13, wherein the step of generating a further programming instruction for the memory cell comprises:

generating a further programming operation when a result of the AND operation is a zero.

15. The method of claim 10, wherein the memory cell includes a plurality of data storage states, and further, wherein the steps of applying a programming pulse to the memory cell in response to the initial and further programming instructions further comprises:

applying a programming pulse having an amplitude and duration sufficient to cause the memory cell to change from a first data storage state to a second data storage state.

16. The method of claim 15, wherein the second data storage state is the next highest state after the first data storage state.

17. The method of claim 10, wherein the step of comparing the data programmed into the memory cell to the data intended to be programmed into the memory cell further comprises:

separating the data programmed into the memory cell into a set of first data type bits and a set of second data type bits;

separating the data intended to be programmed into the memory cell into a set of first data type bits and a set of second data type bits;

performing an exclusive NOR (XNOR) operation between the set of first data type bits of the data programmed into the memory cell and the set of first data type bits of the data intended to be programmed into the memory cell; and performing an exclusive NOR (XNOR) operation between the set of second data type bits of the data programmed into the memory cell and the set of second data type bits of the data intended to be programmed into the memory cell.

18. The method of claim 17, wherein the first data type is the even bits of the data and the second data type is the odd bits of the data.

19. A method for programming a multistate memory cell, comprising:

reading data contained in a multistate memory cell having a plurality of data storage states, wherein the memory cell contains a pair of data bits;

performing an exclusive NOR (XNOR) operation between the data read from the memory cell and data intended to be programmed into the cell, an output of the XNOR operation being a one if a bit of the data read properly compares to a corresponding bit of the data intended to be programmed and zero otherwise;

generating a programming operation instruction to cause further programming of the cell when a result of the XNOR operation indicates that the data read does not properly compare to the intended data by performing an AND operation between the bits of each pair of data bits contained in the output of the XNOR operation;

generating a programming pulse for the memory cell in response to the programming operation instruction by operating a programming voltage pulse generator when the data read does not properly compare to the intended data, the generated programming pulse having an amplitude and duration sufficient to cause the memory cell to change from a present data storage state to the next highest state; and repeating the steps of the method until the comparison step indicates that the data read from the memory cell properly compares with the intended data.

20. A multistate memory system, comprising:

an array of multistate memory cells, wherein each memory cell contains a pair of data bits;

a memory cell read module for reading data contained in a memory cell of the array of multistate memory cells;

a storage module for storing data intended to be programmed into the memory cell;

a comparator for comparing the data read from the multistate memory cell to the data intended to be programmed into the cell by performing an exclusive NOR (XNOR) operation between the data read and the data intended to be programmed into the cell, wherein an output of the comparator is a one if a bit of the data read properly compares to a corresponding bit of the data intended to be programmed and zero otherwise;

a programming instruction generator for generating a programming operation instruction to cause further programming of the multistate memory cells when the data read from the cell does not properly compare to the data intended to be programmed into the cell by performing an AND operation between the bits contained in each bit pair of the output of the comparator; and a programming pulse generator which generates programming pulses for the memory cell in response to the programming operation instruction.

21. A controller for use in programming a multistate memory cell containing a pair of data bits, comprising:

a memory cell read module for reading data contained in the multistate memory cell;

a storage module for storing data intended to be programmed into the multistate memory cell;

a comparator for comparing the data read from the multistate memory cell to the data intended to be programmed into the cell, wherein an output of the comparator is a one if a bit of the data read properly compares to a corresponding bit of the data intended to be programmed and zero otherwise;

a programming instruction generator for generating a programming operation instruction to cause further programming of the multistate memory cell when the data read from the cell does not properly compare to the data intended to be programmed into the cell by collapsing each pair of data bits contained in the output of the comparator to a value of one if both bits are a one, and to a value of zero if either bit is a zero; and a programming pulse generator which generates a programming pulse for the memory cell in response to the programming operation instruction.

22. The controller of claim 21, wherein the comparator for comparing the data read to the data intended to be programmed into the cell performs an exclusive NOR (XNOR) operation between the data read and the data intended to be programmed into the cell.

23. The controller of claim 21, wherein the programming instruction generator performs an AND operation between the bits contained in each bit pair of the output of the comparator.

24. A method for programming a multistate memory cell having a plurality of data storage states, comprising:

accessing data intended to be programmed into the memory cell;

generating an initial programming instruction to program the multistate memory cell when a result of performing an AND operation on a pair of data bits in the data intended to be programmed into the memory cell is a zero;

applying a programming pulse to the memory cell in response to the initial programming instruction;

reading the data programmed into the memory cell;

comparing the data programmed into the memory cell to the data intended to be programmed into the memory cell by performing an exclusive NOR (XNOR) operation between the data programmed into the memory cell and the data intended to be programmed into the memory cell, producing a XNOR result having a plurality of data bits;

performing an AND operation between the data bits of each pair of data bits contained in the XNOR result;

generating a further programming instruction for the memory cell when a result of the AND operation between the data bits of each pair of data bits contained in the XNOR result is a zero;

applying a programming pulse to the memory cell in response to the further programming instruction, the programming pulse having an amplitude and duration sufficient to cause the memory cell to change from a present data storage state to the next highest state; and repeating the previous steps as necessary until the data programmed into the memory cell properly compares to the data intended to be programmed into the memory cell.

25. The method of claim 24, wherein the step of comparing the data programmed into the memory cell to the data intended to be programmed into the memory cell by performing an exclusive NOR (XNOR) operation further comprises:

separating the data programmed into the memory cell into a set of first data type bits and a set of second data type bits;

separating the data intended to be programmed into the memory cell into a set of first data type bits and a set of second data type bits;

performing an exclusive NOR (XNOR) operation between the set, of first data type bits of the data programmed into the memory cell and the set of first data type bits of the data intended to be programmed into the memory cell; and performing an exclusive NOR (XNOR) operation between the set of second data type bits of the data programmed into the memory cell and the set of second data type bits of the data intended to be programmed into the memory cell.

26. The method of claim 25, wherein the first data type is the even bits of the data and the second data type is the odd bits of the data.

* * * * *

UNITED STATES PATENT AND TRADEMARK OFFICE
CERTIFICATE OF CORRECTION

PATENT NO. :   5,768,287

DATED      :   June 16, 1998

INVENTOR(S) :  Robert D. Norman et al.

It is certified that error appears in the above-identified patent and that said Letters Patent is hereby corrected as shown below:

At Col. 3, line 13, please delete "a high voltage programming" please insert --a programming--.

At Col. 3, line 20, delete different)" please insert --different).--

At Col. 5, line 37, please delete "contents which is hereby" and insert --contents of which are hereby--.

At Col. 5, line 49, please delete "08/736,568 filled Oct." and insert --08/736,568 filed Oct.--.

At Col. 6, line 31, please delete "the high voltage program" and insert --the program--.

At Col. 7, line 33, please delete "causes high voltages" and insert --causes programming voltages--.

UNITED STATES PATENT AND TRADEMARK OFFICE
CERTIFICATE OF CORRECTION

PATENT NO. : 5,768,287

DATED : June 16, 1998

INVENTOR(S) : Robert D. Norman et al.

It is certified that error appears in the above-identified patent and that said Letters Patent is hereby corrected as shown below:

At Col. 8, line 36, please delete "the high voltage" and insert --the programming voltage--.

At Col. 8, line 57, please delete "a high voltage programming" and insert --a programming--.

At Col. 9, line 51, please delete "a high voltage programming" and insert --a programming--.

At Col. 10, line 18, please delete "a high voltage" and insert --a programming voltage--.

At Col. 10, line 50, please delete "the high voltage" and insert --the programming voltage--.

At Col. 11, line 30, please delete "a high voltage program sequence" and insert --a programming sequence--.

At Col. 13, line 11, please delete "sent tc flash" and insert --sent to flash--.

At Col. 13, line 40, please delete "further high voltage programming" and insert --further programming--.

At Col. 20, line 31, claim 25, please delete "set, of" and insert --set of--.

Signed and Sealed this

Sixteenth Day of November, 1999

*Attest:*

Q. TODD DICKINSON

*Attesting Officer*   Acting Commissioner of Patents and Trademarks